(12) United States Patent
Huang et al.

(10) Patent No.: US 11,372,059 B2
(45) Date of Patent: Jun. 28, 2022

(54) TESTING DEVICE

(71) Applicant: CommScope Technologies LLC, Hickory, NC (US)

(72) Inventors: Mulan Huang, Jiangsu (CN); Jin Liu, Jiangsu (CN); Qiuliang Wang, Jiangsu (CN); Yujun Zhang, Jiangsu (CN)

(73) Assignee: CommScope Technologies LLC, Hickory, NC (US)

( * ) Notice: Subject to any disclaimer, the term of this patent is extended or adjusted under 35 U.S.C. 154(b) by 31 days.

(21) Appl. No.: 17/002,963

(22) Filed: Aug. 26, 2020

(65) Prior Publication Data
US 2021/0080515 A1     Mar. 18, 2021

(30) Foreign Application Priority Data
Sep. 12, 2019 (CN) .......................... 201910863269.5

(51) Int. Cl.
*G01R 31/68* (2020.01)
*G01R 1/02* (2006.01)

(52) U.S. Cl.
CPC ............... *G01R 31/68* (2020.01); *G01R 1/02* (2013.01)

(58) Field of Classification Search
CPC ........... G01R 31/68; G01R 1/02; G01R 29/10
(Continued)

(56) References Cited

U.S. PATENT DOCUMENTS 5,017,865 A * 5/1991 Oldfield ............. G01R 31/2822
                                                            333/260
5,075,630 A * 12/1991 Babbitt .................. G01R 1/045
                                                         324/750.25

(Continued)

FOREIGN PATENT DOCUMENTS

| CN | 210894515 U | 6/2020 |
|----|-------------|--------|
| KR | 101256096 B1 | 4/2013 |
| KR | 101632276 B1 | 6/2016 |

OTHER PUBLICATIONS

"International Search Report and Written Opinion corresponding to International Application No. PCT/US2020/048072 dated Dec. 11, 2020".

(Continued)

*Primary Examiner* — Christopher P McAndrew
(74) *Attorney, Agent, or Firm* — Myers Bigel, P.A.

(57) ABSTRACT

The present disclosure relates to a testing device comprising a bracket including a first groove and a second groove parallel to each other, wherein the first groove and the second groove run through an inner surface of the bracket perpendicularly to a thickness direction of the testing device; a plate assembly including a first plate and a second plate parallel to each other, wherein the first plate is disposed within the first groove and fits closely within the first groove along a length direction and a thickness direction of the testing device, the second plate is disposed within the second groove, with a gap present in the second groove along a length direction and/or a thickness direction of the testing device; a connector array including a plurality of connector assemblies disposed on the plate assembly in a predetermined pattern, wherein each of the plurality of connector assemblies is connected between the first plate and the second plate; and a displacing tool disposed on the bracket and/or the plate assembly and configured to displace the second plate relative to the first plate within the second groove along a length direction and/or a thickness direction of the testing device. The testing device may simulate various different axial deviations and/or angular deviations of the opposed printed circuit boards, and may be used to test the performance parameters such as low PIM, return loss and insertion loss between the printed circuit boards and the connectors under different axial deviations and/or angular deviations.

20 Claims, 9 Drawing Sheets

(58) Field of Classification Search
USPC .................................................. 324/750.25
See application file for complete search history.

(56) References Cited

U.S. PATENT DOCUMENTS

| | | | |
|---|---|---|---|
| 6,870,448 B2* | 3/2005 | Whitener | ............... H01P 5/085 |
| | | | 333/256 |
| 9,871,498 B2* | 1/2018 | Ooi | ................... G01R 29/0878 |
| 10,031,159 B2 | 7/2018 | He et al. | |
| 2011/0109341 A1* | 5/2011 | Schmegner | .......... G01R 1/0408 |
| | | | 324/756.05 |
| 2014/0146866 A1 | 5/2014 | Strachan et al. | |
| 2017/0122990 A1 | 5/2017 | Massa et al. | |

OTHER PUBLICATIONS

"International Preliminary Report on Patentability corresponding to International Application No. PCT/US2020/048072 dated Mar. 24, 2022".

* cited by examiner

TESTING DEVICE

RELATED APPLICATION

The present application claims priority from and the benefit of Chinese Patent Application No. 201910863269.5, filed Sep. 12, 2019, the disclosure of which is hereby incorporated herein in its entirety.

FIELD OF THE INVENTION

The present disclosure generally relates to the field of a base station antenna. More specifically, the present disclosure relates to a performance testing device for an array of miniature connectors in a base station antenna.

BACKGROUND OF THE INVENTION

A plurality of printed circuit boards are arranged inside a base station antenna for accomplishing transmitting signals, receiving signals, and other functions. The printed circuit boards may be connected therebetween by miniature connectors, which are disposed on the printed circuit boards in various array patterns.

Due to reasons such as manufacturing tolerances and mounting processes, multiple connector mounting positions on two opposed printed circuit boards may not be aligned precisely, thereby resulting in an angular deviation. In addition, the axial distance between the substrates of two opposed printed circuit boards may deviate from a nominal value, thereby resulting in an axial deviation. Both the axial deviation and angular deviation between the printed circuit boards may impact an effective connection between the printed circuit boards and the miniature connectors, such as to further affect the performance parameters such as passive intermodulation (PIM), return loss, and insertion loss.

Therefore, there may be a need to develop a testing device for performing a simulative test of whether the performance parameters such as low PIM, return loss, and insertion loss between the printed circuit boards and the connectors are affected in the event of an axial and/or angular deviation between the opposed printed circuit boards.

SUMMARY OF THE INVENTION

One of the objects of the present invention is to provide a testing device that is capable of overcoming at least one of the defects in the prior art.

The subject art of the present disclosure has been illustrated according to various aspects described below.

As a first aspect, embodiments of the invention are directed to a testing device, wherein the testing device comprises: a bracket including a first groove and a second groove parallel to each other, wherein the first groove and the second groove run through an inner surface of the bracket perpendicularly to a thickness direction of the testing device; a plate assembly including a first plate and a second plate parallel to each other, wherein the first plate is disposed within the first groove and fits closely within the first groove along a length direction and a thickness direction of the testing device, the second plate is disposed within the second groove, with a gap present in the second groove along a length direction and/or a thickness direction of the testing device; a connector array including a plurality of connector assemblies disposed on the plate assembly in a predetermined pattern, wherein each of the plurality of connector assemblies is connected between the first plate and the second plate; and a displacing tool disposed on the bracket and/or the plate assembly and configured to displace the second plate relative to the first plate within the second groove along a length direction and/or a thickness direction of the testing device.

In some embodiments, the displacing tool includes first threaded members extending along a thickness direction of the testing device, wherein the first threaded member is disposed on the first plate and the second plate, and configured to adjust a position of the second plate relative to the first plate along a thickness direction of the testing device.

In some embodiments, the first threaded member has a head located outside the first plate, a stem passing through the first plate, and a tip resting against an inner surface of the second plate.

In some embodiments, the first threaded members are disposed at four corners of the first plate and the second plate.

In some embodiments, the bracket is generally U-shaped, and includes a base, and parallel arms projecting from both ends of the base.

In some embodiments, the displacing tool includes second threaded members extending along a length direction of the testing device, wherein the second threaded member is provided to pass through one of the arms, and configured to adjust a position of the second plate relative to the first plate along a length direction of the testing device.

In some embodiments, the second threaded member has a head located outside the arm, a stem passing through the arm, and a tip resting against a lateral surface of the second plate.

In some embodiments, the positions of the second threaded members on the two arms are mirror images of each other.

In some embodiments, the displacing tool includes a first group of pin holes disposed on the first plate and the second plate, a second group of pin holes disposed on the first plate and the second plate, and pins capable of inserting into the first group of pin holes and the second group of pin holes, wherein the first group of pin holes and the second group of pin holes and the pins are configured to adjust a position of the second plate relative to the first plate along a length direction of the testing device.

In some embodiments, the positions of the first group of pin holes on the first plate and on the second plate along a length direction of the testing device are aligned with each other, and the positions of the second group of pin holes on the first plate and on the second plate along a length direction of the testing device deviate from each other.

In some embodiments, the first plate and the second plate have substantially the same size and shape.

In some embodiments, the plate assembly includes a sleeve disposed between the first plate and the second plate, wherein the sleeve is configured to maintain that the first plate and the second plate in a spaced apart relationship from each other.

In some embodiments, the plate assembly further includes one or more connection bolts, which connect the second plate to the first plate and press the first plate and the second plate against both ends of the sleeve.

In some embodiments, the connection bolts are positioned at the center of the first plate and the second plate.

In some embodiments, a wedge is disposed in a gap between the second groove of the bracket and the second plate, to press the first plate and the second plate against both ends of the sleeve.

In some embodiments, a third threaded member which is disposed on an arm and extends in a thickness direction of the testing device, has a head located outside the arm, a stem passing through a portion of the arm and a tip resting against an outer surface of the second plate.

In some embodiments, the connector assembly includes a connector and a first adapter and a second adapter that are connected to both ends of the connector.

In some embodiments, the first adapter is fixed on the first plate, and has one port disposed outside of the first plate and the other port opposite thereto disposed inside of the first plate.

In some embodiments, the second adapter is fixed on the second plate, and has one port disposed outside of the second plate, and the other port opposite thereto disposed inside of the second plate.

As a second aspect, embodiments of the invention are directed to a testing device, wherein the testing device comprises: a bracket including a first groove and a second groove parallel to each other, wherein the first groove and the second groove run through an inner surface of the bracket perpendicularly to a thickness direction of the testing device; a plate assembly including a first plate and a second plate parallel to each other, wherein the first plate is disposed within the first groove and fits closely within the first groove along a length direction and a thickness direction of the testing device, the second plate is disposed within the second groove, with a gap present in the second groove along a length direction and/or a thickness direction of the testing device; a connector array including a plurality of connector assemblies disposed on the plate assembly in a predetermined pattern, wherein each of the plurality of connector assemblies is connected between the first plate and the second plate; a first displacing tool disposed on the bracket configured to displace the second plate relative to the first plate within the second groove along a length direction of the testing device; and a second displacing tool disposed on the plate assembly configured to displace the second plate relative to the first plate within the second groove along a thickness direction of the testing device.

Other features and advantages of the subject art of the present disclosure will be formulated in the following descriptions, and will be partially obvious from said descriptions, or may be learned by practicing the subject art of the present disclosure. Advantages of the subject art of the present disclosure will be realized and attained by the structure particularly set forth in the written description as well as its claims and drawings.

It should be understood that, the aforementioned general descriptions and the following detailed descriptions are all exemplary and descriptive, and intended to provide further illustrations of the subject art of the present disclosure for which protection is sought.

BRIEF DESCRIPTION OF THE DRAWINGS

After reading the embodiments hereinafter in conjunction with the accompanying drawings, a plurality of aspects of the present invention will be better understood. In the accompanying drawings.

DETAILED DESCRIPTION

Figure 1A:
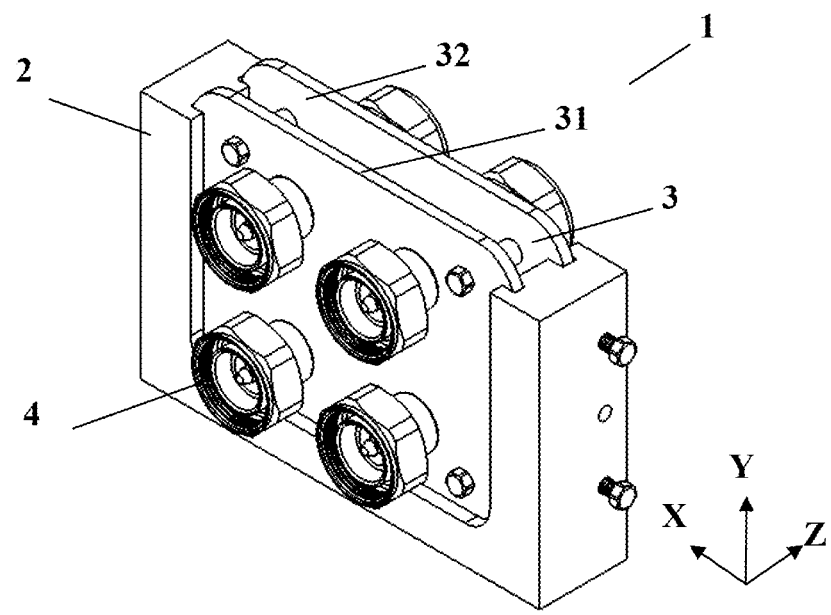
FIGS. 1A-1B respectively show an assembled perspective view and an exploded perspective view of a testing device according to an embodiment of the present disclosure.

The present disclosure will be described below with reference to the drawings, in which several embodiments of the present disclosure are shown. It should be understood, however, that the present disclosure may be presented in multiple different ways, and not limited to the embodiments described below. In fact, the embodiments described hereinafter are intended to make a more complete disclosure of the present disclosure and to adequately explain the protection scope of the present disclosure to a person skilled in the art. It should also be understood that, the embodiments disclosed herein can be combined in various ways to provide more additional embodiments.

It should be understood that, in all the drawings, the same reference signs present the same elements. In the drawings, for the sake of clarity, the sizes of certain features may be deformed.

It should be understood that, the wording in the specification is only used for describing particular embodiments and is not intended to define the present disclosure. All the terms used in the specification (including the technical terms and scientific terms), have the meanings as normally understood by a person skilled in the art, unless otherwise defined. For the sake of conciseness and/or clarity, the well-known functions or constructions may not be described in detail any longer.

The singular forms "a/an", "said" and "the" as used in the specification, unless clearly indicated, all contain the plural forms. The wordings "comprising", "containing" and "including" used in the specification indicate the presence of the claimed features, but do not repel the presence of one or more other features. The wording "and/or" as used in the specification includes any and all combinations of one or more of the relevant items listed. The phases "between X and Y" and "between about X and Y" as used in the specification should be construed as including X and Y. The phrase "between about X and Y" as used in the present specification means "between about X and about Y", and the phrase "from about X to Y" as used in the present specification means "from about X to about Y".

In the specification, when one element is referred to as being "on" another element, "attached to" another element, "connected to" another element, "coupled to" another element, or "in contact with" another element, the element may be directly located on another element, attached to another element, connected to another element, coupled to another element, or in contact with another element, or there may be present with an intermediate element. By contrast, where one element is referred to as being "directly" on another element, "directly attached to" another element, "directly connected to" another element, "directly coupled to" another element, or "in direct contact with" another element, there will not be present with an intermediate element. In the specification, where one feature is arranged to be "adjacent" to another feature, it may mean that one feature has a portion that overlaps with an adjacent feature or a portion that is located above or below an adjacent feature.

In the specification, the spatial relation wordings such as "up", "down", "left", "right", "forth", "back", "high", "low" and the like may describe a relation of one feature with another feature in the drawings. It should be understood that, the spatial relation wordings also contain different orientations of the apparatus in use or operation, in addition to containing the orientations shown in the drawings. For example, when the apparatus in the drawings is overturned, the features previously described as "below" other features may be described to be "above" other features at this time. The apparatus may also be otherwisely oriented (rotated 90 degrees or at other orientations). At this time, the relative spatial relations will be explained correspondingly.

In the present embodiment, the X direction is referred to as the length direction of the testing device 1, the Y direction is referred to as the width direction of the testing device 1, and the Z direction is referred to as the thickness direction of the testing device 1.

Figure 1B:
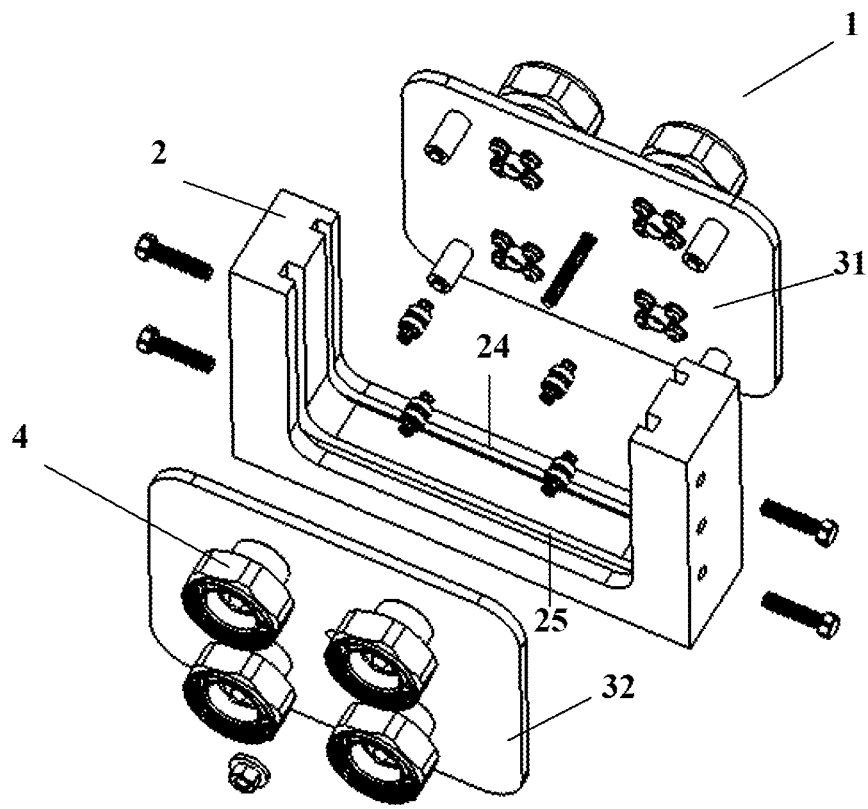
Figure 2A:
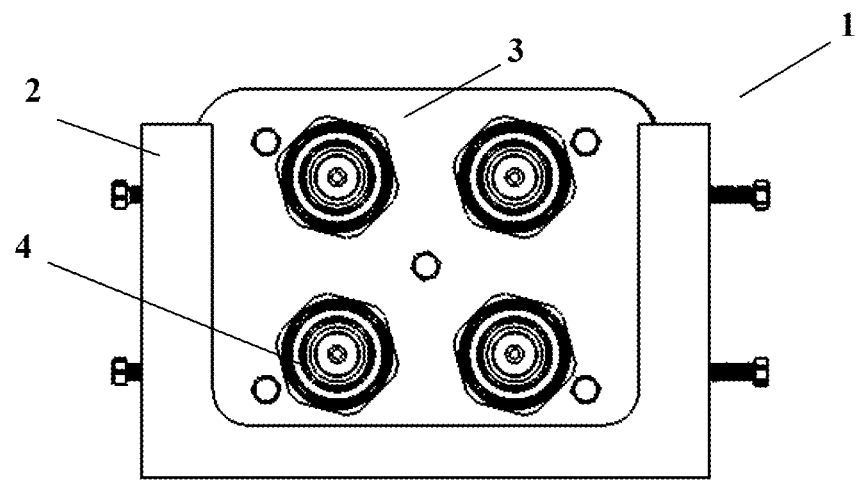
FIGS. 2A-2C respectively show a front view, a top view and a side views of the testing device of FIGS. 1A-1B.
Figure 2B:
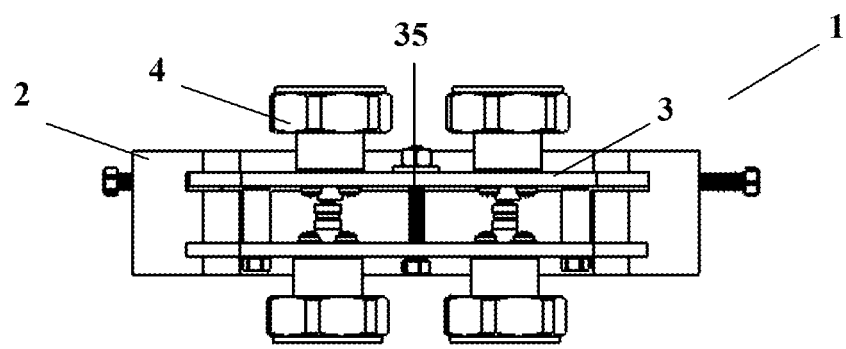
Figure 2C:
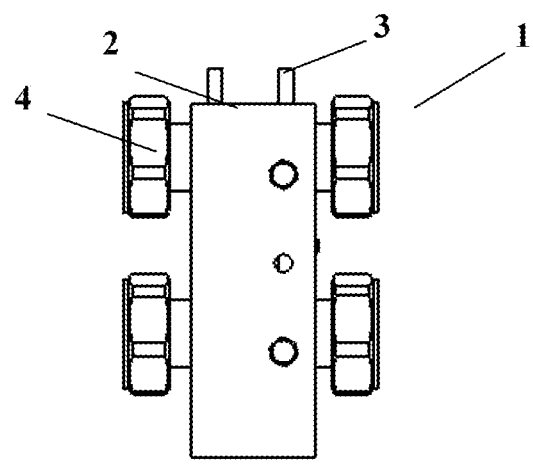

FIGS. 1A-1B show an assembled perspective view and an exploded perspective view of a testing device 1 according to an embodiment of the present disclosure; and FIGS. 2A-2C respectively show a front view, a top view and a side view of the testing device 1 according to an embodiment of the present disclosure. As shown in FIGS. 1A-1B and 2A-2C, the testing device 1 comprises a bracket 2, and a plate assembly 3 and a connector array 4 which are disposed on the bracket 2. The bracket 2 is used to support the plate assembly 3. The plate assembly 3 simulates two opposed printed circuit boards in the base station antenna, and carries the connector array 4 to be tested.

Figure 3:
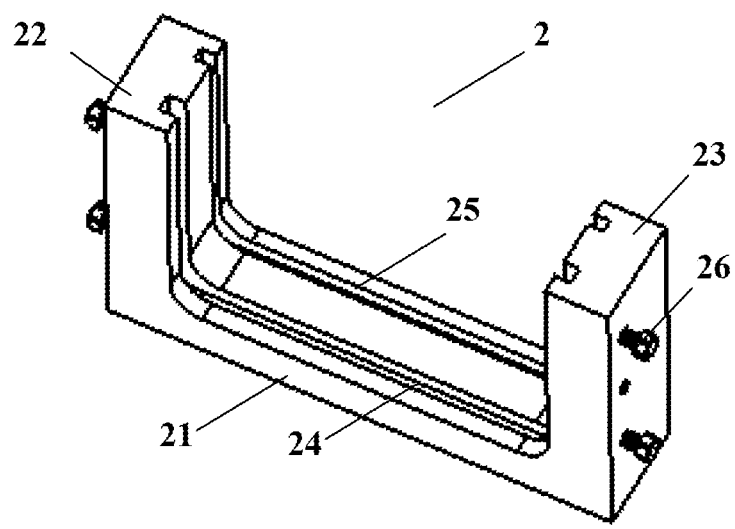
FIG. 3 shows a perspective view of a bracket of the testing device of FIGS. 1A-IB.
Figure 4A:
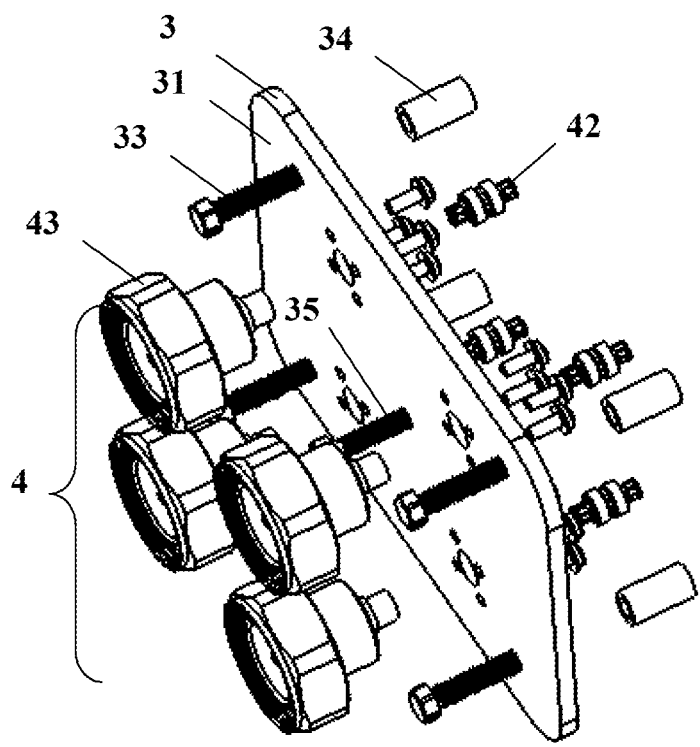
FIGS. 4A-4B respectively show an exploded perspective view and an assembled perspective view of a first plate and an associated connector array of the testing device of FIGS. 1A-1B.
Figure 4B:
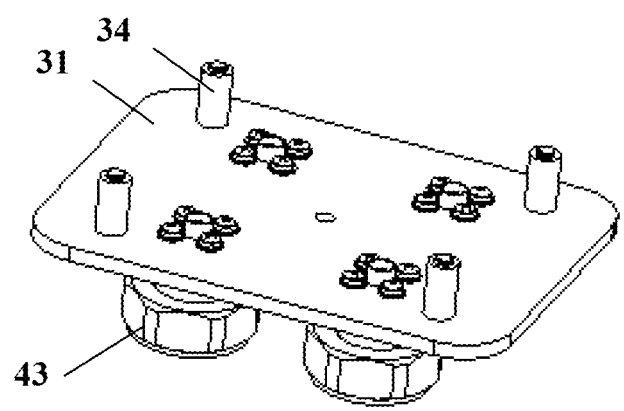
Figure 5A:
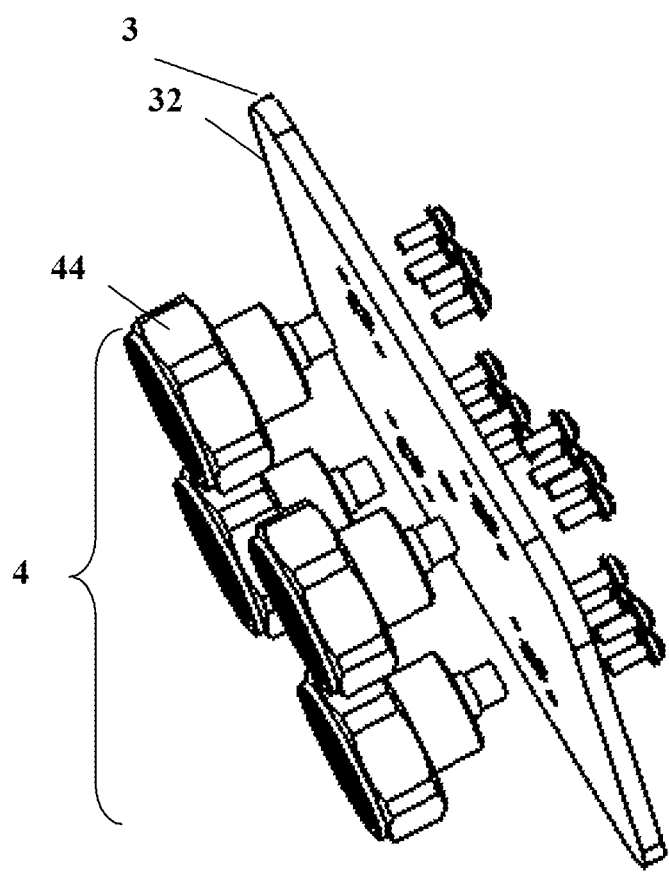
FIGS. 5A-5B respectively show an exploded perspective view and an assembled perspective view of a second plate and an associated connector array of the testing device of FIGS. 1A-1B.
Figure 5B:
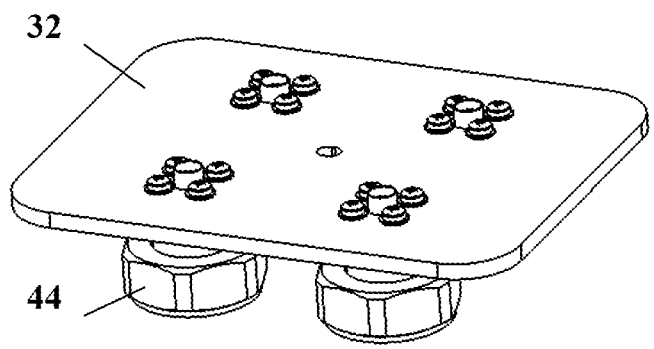

As shown in FIG. 3, the bracket 2 is substantially U-shaped, and includes a base 21, and two parallel arms 22 and 23 projecting perpendicularly from both ends of the base 21. The base 21 and the two arms 22, 23 may be integrally formed, or may be formed separately and connected together in any known mechanical manner. The inner side and/or the outer side of the connection portion of the base 21 and the two arms 22, 23 may be rounded.

The bracket 2 is provided with two grooves 24 and 25 parallel to each other in its inner surface for receiving the plate assembly 3. The two grooves 24 and 25 run through the entire inner surfaces of the base 21 and the two arms 22, 23 perpendicularly to the thickness direction of the testing device 1.

As shown in FIGS. 1A-1B, the plate assembly 3 includes a first plate 31 and a second plate 32 that are parallel to each other. The first plate 31 and the second plate 32 jointly carry the connector array 4 to be tested. The first plate 31 and the second plate 32 have substantially the same size and shape. The first plate 31 and the second plate 32 are both substantially rectangular, and the four corners of the rectangle may be rounded. The first plate 31 and the second plate 32 may be substantially planar, and have substantially uniform thicknesses. The first plate 31 and the second plate 32 may be inserted into the grooves 24 and 25 of the bracket 2 respectively.

The groove 24 has a thickness smaller than that of the groove 25, and the distance between the bottom surfaces of the two arm sections of the groove 24 is smaller than the distance between the bottom surfaces of the two arm sections of the groove 25. Specifically, the groove 24 has a thickness substantially equal to that of the first plate 31, and the distance between the bottom surfaces of the two arm sections of the groove 24 is substantially equal to the length of the first plate 31, so that both of them may maintain a close fit therebtween after the plate 31 is inserted into the groove 24, and there is no sway along the length and thickness directions of the testing device 1. The groove 25 has a thickness greater than that of the second plate 32, and the distance between the bottom surfaces of the two arm sections of the groove 25 is greater than the length of the second plate 32, so that there are gaps between the second plate 32 and the groove 25 along both the length direction and the thickness direction of the testing device 1, and the second plate 32 may be displaced within the groove 25 after the second plate 32 is inserted into the groove 25. The closest distance of the second plate 32 to the first plate 24 along the thickness direction of the testing device 1 herein is defined as the reference distance L1 between the second plate 32 and the first plate 31 (see FIG. 8A).

As shown in FIGS. 4A-4B and 5A-5B, the plate assembly 3 further comprises, in addition to the first plate 31 and the second plate 32, several threaded members 33 disposed between the first plate 31 and the second plate 32, to adjust the displacement of the second plate 32 relative to the first plate 31 along the thickness direction of the testing device 1. The threaded member 33 has a head located outside the first plate 31, a stem passing through a threaded through hole in the first plate 31, and a tip resting against the inner surface of the second plate 32 or in the threaded blind hole of the inner surface. In some embodiments, the threaded member 33 is disposed at the four corners of the first plate 31 and the second plate 32. The threaded member 33 may be, for example, a screw, a bolt, a stud, or the like.

The plate assembly 3 may further include a sleeve 34 having a length L1 disposed between the first plate 31 and the second plate 32, to keep the first plate 31 and the second plate 32 spaced apart from each other. The sleeve 34 may be sleeved on the stem of the threaded member 33. The plate assembly 3 may also include one or more connection bolts 35 (FIG. 2B) that connect the second plate 32 to the first plate 31, and press the first plate 31 and the second plate 32 against both ends of the sleeve 34, to ensure that the distance spaced apart between the first plate 31 and the second plate 32 is the reference distance L1. The connection bolts 35 may be located at the center of the first plate 31 and the second plate 32. In one embodiment, instead of the connection bolts 35, a wedge may be provided in the gap between the groove 25 of the bracket 2 and the second plate 32, to press the first plate 31 and the second plate 32 on both ends of the sleeve 34, and ensure a reference distance L1 spaced apart between the first plate 31 and the second plate 32. In another embodiment, instead of the connection bolts 35, a threaded member extending in the thickness direction of the testing device 1 is provided on the arms 22 and 23 of the bracket 2, and and has a head located outside the arms 22 and 23, a stem passing through a portion of the arms 22 and 23 and a tip resting against the outer surface of the second plate 32, to press the first plate 31 and the second plate 32 against both ends of the sleeve 34 and maintain a reference distance L1 spaced apart between the first plate 31 and the second plate 32.

As shown in FIGS. 4A-4B, 5A-5B and 6, the connector array 4 includes a plurality of connector assemblies 41 disposed on the plate assembly 3 in a predetermined pattern. Each connector assembly 41 includes a connector 42 and two adapters 43 and 44 that are connected to both ends of the connector 42.

Figure 6:
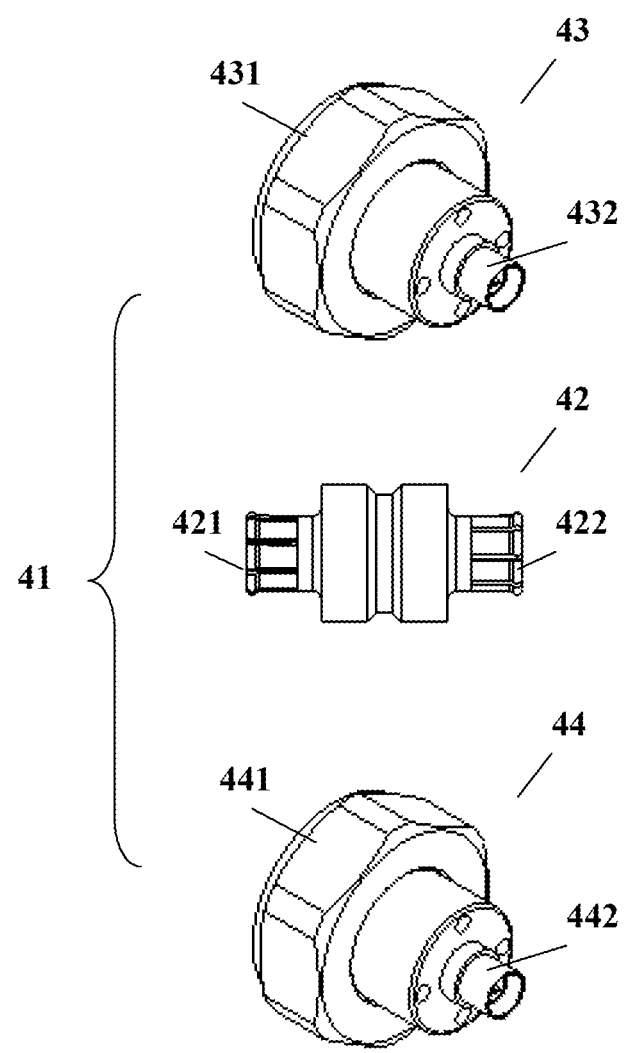
FIG. 6 respectively shows an exploded perspective view of a connector assembly for the first and second plates.

As shown in FIG. 6, the connector 42 has two ports 421 and 422 that are longitudinally opposite to each other, and the two ports 421 and 422 are connected to the adapters 43 and 44 respectively.

The adapter 43 has two ports 431 and 432 that are longitudinally opposite to each other. The port 431 is configured for connection to the output terminal of one electronic testing device (not shown), and the port 432 is configured for connection to the port 421 of the connector 42. The adapter 43 may be secured to the first plate 31 in any known mechanical manner such as a screw, a rivet, and the like. The port 431 of the adapter 43 is disposed outside the first plate 31, and the port 432 is disposed inside the first plate 31. The port 432 of the adapter 43 may be a male, and the port 421 of connector 42 may be a corresponding female; or the port 432 of the adapter 43 may be a female, and the port 421 of the connector 42 may be a corresponding male.

Similar to the adapter 43, the adapter 44 has two ports 441 and 442 that are longitudinally opposite to each other. The port 441 is configured for connection to the output terminal of another electronic testing device (not shown), and the port 442 is configured for connection to the port 422 of the connector 42. The adapter 44 may be secured to the second plate 32 in any known mechanical manner such as a screw, a rivet, and the like. The port 441 of the adapter 44 is disposed outside the second plate 32, and the port 442 is disposed inside the second plate 32. The port 442 of the adapter 44 may be a male, and the port 421 of connector 42 may be a corresponding female; or the port 442 of the adapter 44 may be a female, and the port 421 of the connector 42 may be a corresponding male.

In the present embodiment, the connector 42 may be a miniaturized RF connector, such as a 1.5-3.5 female to 1.5-3.5 female, a 1.5-3.5 male to 1.5-3.5 male, and a 1.5-3.5 female to 1.5-3.5 male, or not limited to 1.5-3.5 models. The adapters 43 and 44 may be adapters in which an RF connector of the 7/16 Din type, 4.3-10 type, N type, 4.1-9.5 type or the like is adapted to the miniaturized RF connector. In the event of testing low PIM performance, the adapter 43 is connected to a testing port of a low PIM testing device (not shown), and the adapter 44 is connected to a low PIM load (not shown), so as to form a loop to perform a low passive intermodulation (PIM) test. In the case of testing the performances of return loss and insertion loss, the adapter 43 is connected to a testing port of a vector network analyzer (not shown), while the adapter 44 is connected to a 50 Ω impedance adapter (not shown), so as to form a loop to test return loss and insertion loss.

Returning to FIG. 3, the bracket 2 also includes several threaded members 26 extending through its arms 22 and 23, to adjust the displacement of the second plate 32 relative to the first plate 31 along the length direction of the testing device 1. The threaded member 26 extending along the length direction of the testing device 1 has a head located outside the arms 22 and 23, a stem passing through threaded through holes of the arms 22 and 23, and a tip resting against the lateral surface of the second plate 32 or in the threaded blind hole of the lateral surface. In some embodiments, each of the arms 22 and 23 is provided with two threaded members 26 spaced apart, and the positions of the threaded member 26 on the arm 22 and the threaded member 26 on the arm 23 are symmetrical to each other. The threaded member 26 may be, for example, a screw, a bolt, a stud, or the like.

Figure 7A:
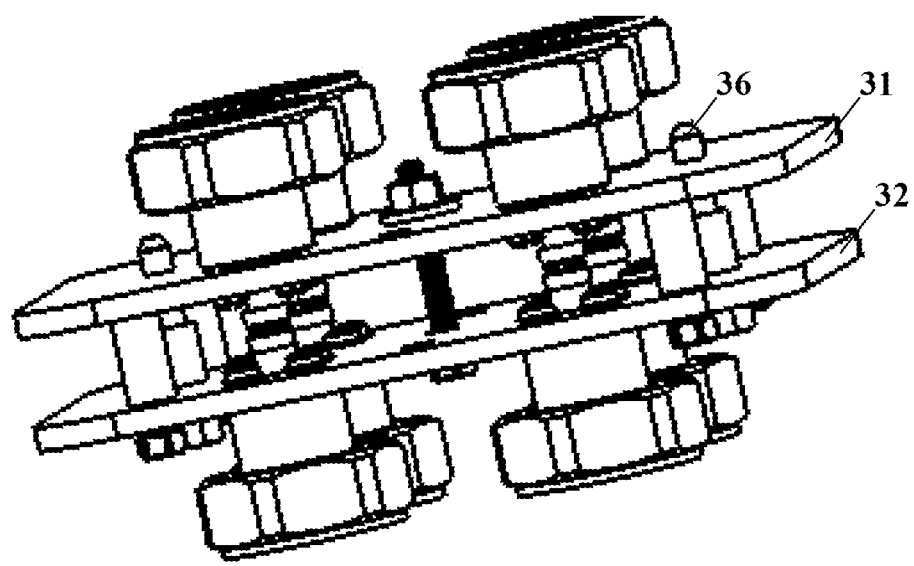
FIGS. 7A and 7B respectively show a perspective view of a plate assembly in another embodiment.
Figure 7B:
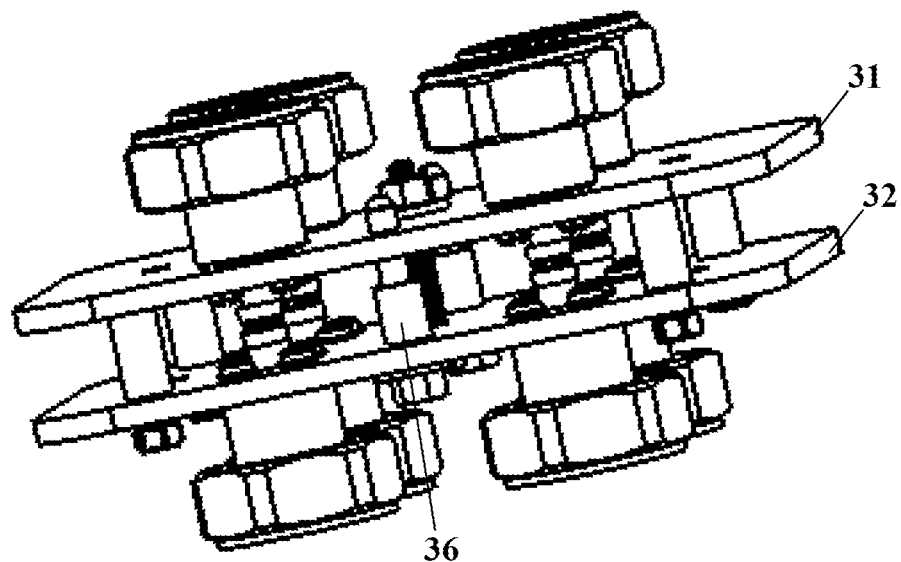

In another embodiment, as shown in FIGS. 7A and 7B, instead of the threaded member 26, a combination of two groups of pin holes and guide pins 36 on the first plate 31 and the second plate 32 of the plate assembly 3 is utilized to adjust the displacement of the second plate 32 relative to the first plate 31 along the length direction of the testing device 1. As shown in FIG. 7A, the positions of the first group of pin holes on the first plate 31 and the second plate 32 along the length direction of the testing device 1 are aligned with each other, so that the first plate 31 and the second plate 32 are aligned when the guide pin 36 is connected in the first group of pin holes. As shown in FIG. 7B, the positions of the second group of pin holes on the first plate 31 and the second plate 32 along the length direction of the testing device 1 deviate from each other, so that the second plate 32 is displaced relative to the first plate 31 along the length direction of the testing device 1 when the guide pin 36 is connected in the second group of pin holes.

The testing device 1 according to an embodiment of the present disclosure may test the electrical performance (for example, low PIM, return loss, insertion loss, and the like) of the connector array 4 in various positional states of the plate assembly 3. FIGS. 8A-8D show four positional states of a plate assembly of the testing device 1 according to an embodiment of the present disclosure. In each positional state, two electronic test devices are connected to the output terminals 431 and 441 of the adapters 43 and 44 respectively, to test the electrical performance of the connector array 4 in each positional state.

Figure 8A:
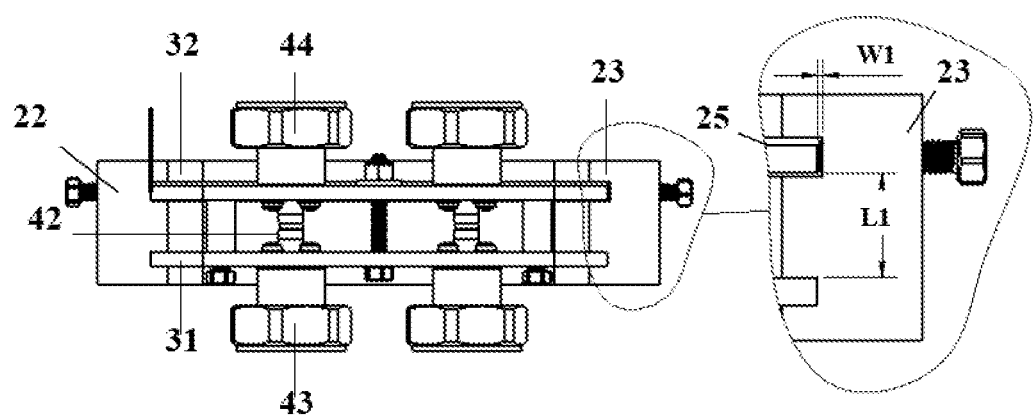
FIGS. 8A-8D respectively show different positional states of the testing device of FIGS. 1A-1B.

FIG. 8A shows the testing device 1 in a normal position. At this time, there is no deviation between the first plate 31 and the second plate 32 along the length direction and the thickness direction of the testing device 1, that is, the first plate 31 and the second plate 32 are parallel to and aligned with each other. Thus, the connector 42 and the two adapters 43 and 44 in connection are also in a coaxial alignment and close contact state therebetween. The reference distance between the second plate 32 and the first plate 31 is L1, and the second plate 32 is closely attached to the arm 22 section of the groove 25, and spaced apart from the arm 23 section of the groove 25 by W1.

Figure 8B:
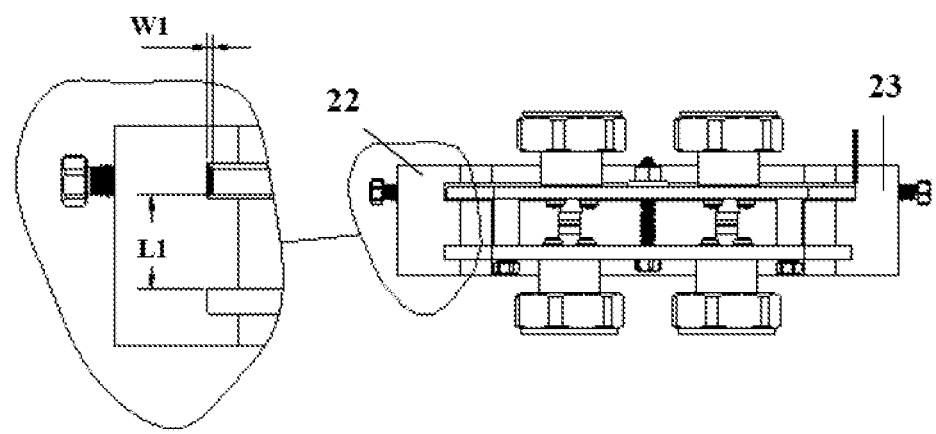

FIG. 8B shows the testing device 1 in an angularly deviating position. The testing device 1 in a normal state is operated as follows to reach an angularly deviating position: the threaded member 26 on the arm 22 is screwed outward, and the threaded member 26 on the arm 23 is screwed inward correspondingly. Thus, there is a displacement between the first plate 31 and the second plate 32 along the length direction rather than the thickness of the testing device 1, that is, the first plate 31 and the second plate 32 are substantially parallel to and are not aligned with each other. The connector 42 and the two adapters 43 and 44 in connection are also in different axially aligned states therebetween.

Figure 8C:
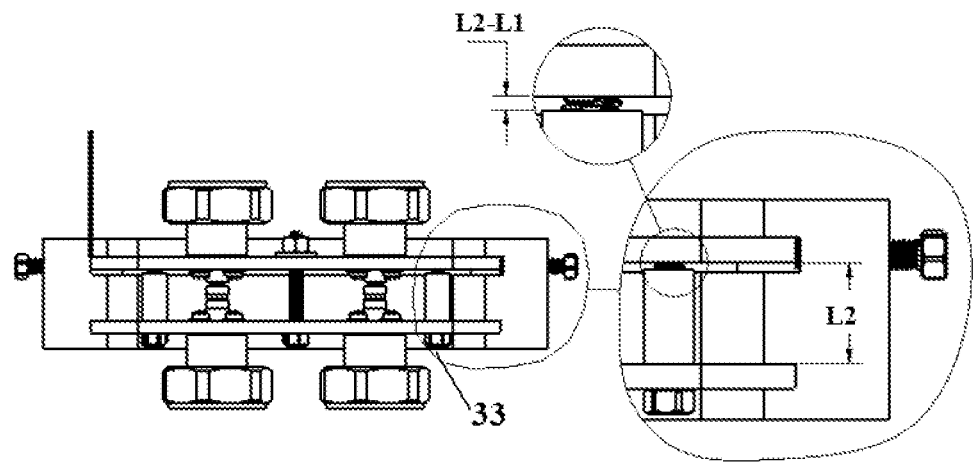

FIG. 8C shows the testing device 1 in an axially deviating position. The testing device 1 in a normal state is operated as follows to reach an axially deviating position: the threaded member 33 is screwed inward or screwed outward. Thus, there is a displacement between the first plate 31 and the second plate 32 along the thickness direction rather than the length direction of the testing device 1, that is, the first plate 31 and the second plate 32 are still parallel to and aligned with each other. The connector 42 and the two adapters 43 and 44 in connection are in an axially aligned state therebetween, but cannot be in close contact but with a gap L2-L1 in the axial direction.

Figure 8D:
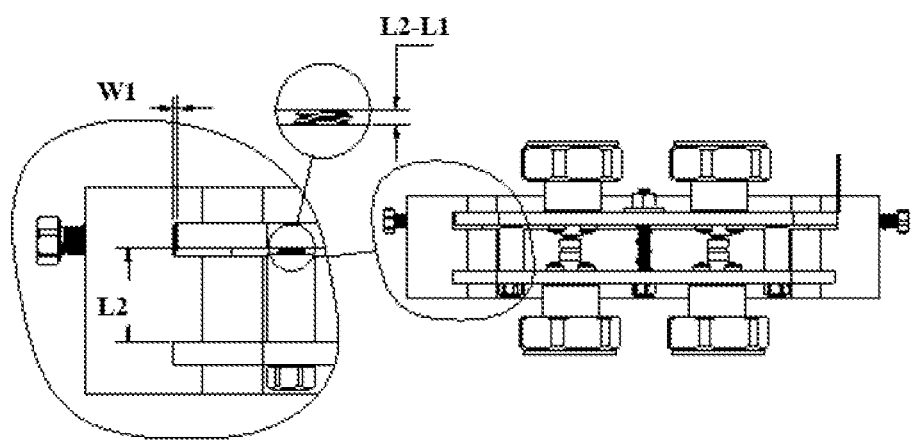

FIG. 8D shows the testing device 1 in an axially and angularly deviating position. The testing device 1 in a normal state is operated as follows to reach an axial and angular deviation position: the threaded member 26 on the arm 22 is screwed outward, and the threaded member 26 on the arm 23 is screwed inward correspondingly. In addition, the threaded member 33 is screwed inward or outward. Thus, there is displacement between the first plate 31 and the second plate 32 along both the thickness direction and the length direction of the testing device 1, that is, the first plate 31 and the second plate 32 are substantially parallel to, and are not aligned with each other. The connector 42 and the two adapters 43 and 44 in connection are not in an axially aligned state therebetween, and cannot be in close contact but with a gap L2-L1 in the axial direction.

The testing device 1 according to an embodiment of the present disclosure may simulate various different axial deviations and/or angular deviations of the opposed printed circuit boards, and may be used to test the performance parameters such as low PIM, return loss and insertion loss between the printed circuit boards and the connectors under different axial deviations and/or angular deviations.

Although the exemplary embodiments of the present disclosure have been described, a person skilled in the art should understand that, he or she can make multiple changes and modifications to the exemplary embodiments of the present disclosure without substantively departing from the spirit and scope of the present disclosure. Accordingly, all the changes and modifications are encompassed within the protection scope of the present disclosure as defined by the claims. The present disclosure is defined by the appended claims, and the equivalents of these claims are also contained therein.

What is claimed is:

1. A testing device, the testing device comprising:
a bracket including a first groove and a second groove parallel to each other, wherein the first groove and the second groove run through an inner surface of the bracket perpendicularly to a thickness direction of the testing device;
a plate assembly including a first plate and a second plate parallel to each other, wherein at least one edge of the first plate is received within the first groove and fits closely within the first groove along a length direction and a thickness direction of the testing device, and at least one edge of the second plate is received within the second groove, with a gap present between the at least one edge of the second plate and the second groove along a length direction and/or a thickness direction of the testing device;
a connector array including a plurality of connector assemblies disposed on the plate assembly in a predetermined pattern, wherein each of the plurality of connector assemblies is connected between the first plate and the second plate; and
a displacing tool disposed on the bracket and/or the plate assembly and configured to displace the second plate relative to the first plate within the second groove along a length direction and/or a thickness direction of the testing device.

2. The testing device according to claim 1, characterized in that the displacing tool includes first threaded members extending along a thickness direction of the testing device, wherein the first threaded member is disposed on the first plate and the second plate, and configured to adjust a position of the second plate relative to the first plate along a thickness direction of the testing device.

3. The testing device according to claim 2, characterized in that the first threaded member has a head located outside the first plate, a stem passing through the first plate, and a tip resting against an inner surface of the second plate.

4. The testing device according to claim 2, characterized in that the first threaded members are disposed at four corners of the first plate and the second plate.

5. The testing device according to claim 1, characterized in that the bracket is generally U-shaped, and includes a base, and parallel arms projecting from both ends of the base.

6. The testing device according to claim 5, characterized in that the displacing tool includes second threaded members extending along a length direction of the testing device, wherein the second threaded member is provided to pass through one of the arms, and configured to adjust a position of the second plate relative to the first plate along a length direction of the testing device.

7. The testing device according to claim 5, characterized in that the second threaded member has a head located outside the arm, a stem passing through the arm, and a tip resting against a lateral surface of the second plate.

8. The testing device according to claim 6, characterized in that the positions of the second threaded members on the two arms are mirror images of each other.

9. The testing device according to claim 1, characterized in that the displacing tool includes a first group of pin holes disposed on the first plate and the second plate, a second group of pin holes disposed on the first plate and the second plate, and pins capable of inserting into the first group of pin holes and the second group of pin holes, wherein the first group of pin holes and the second group of pin holes and the pins are configured to adjust a position of the second plate relative to the first plate along a length direction of the testing device.

10. The testing device according to claim 9, characterized in that the positions of the first group of pin holes on the first plate and on the second plate along a length direction of the testing device are aligned with each other, and the positions of the second group of pin holes on the first plate and on the second plate along a length direction of the testing device deviate from each other.

11. The testing device according to claim 1, characterized in that the first plate and the second plate have substantially the same size and shape.

12. The testing device according to claim 1, characterized in that the plate assembly includes a sleeve disposed between the first plate and the second plate, wherein the sleeve is configured to maintain that the first plate and the second plate in a spaced apart relationship from each other.

13. The testing device according to claim 12, characterized in that the plate assembly further includes one or more connection bolts, which connect the second plate to the first plate and press the first plate and the second plate against both ends of the sleeve.

14. The testing device according to claim 13, characterized in that the connection bolts are positioned at the center of the first plate and the second plate.

15. The testing device according to claim 12, characterized in that a wedge is disposed in a gap between the second groove of the bracket and the second plate, to press the first plate and the second plate against both ends of the sleeve.

16. The testing device according to claim 5, characterized in that a third threaded member which is disposed on an arm and extends in a thickness direction of the testing device, has a head located outside the arm, a stem passing through a portion of the arm and a tip resting against an outer surface of the second plate.

17. The testing device according to claim 1, characterized in that the connector assembly includes a connector and a first adapter and a second adapter that are connected to both ends of the connector.

18. The testing device according to claim 17, characterized in that the first adapter is fixed on the first plate, and has one port disposed outside of the first plate and the other port opposite thereto disposed inside of the first plate.

19. The testing device according to claim 17, characterized in that the second adapter is fixed on the second plate, and has one port disposed outside of the second plate, and the other port opposite thereto disposed inside of the second plate.

20. A testing device, the testing device comprising:
- a bracket including a first groove and a second groove parallel to each other, wherein the first groove and the second groove run through an inner surface of the bracket perpendicularly to a thickness direction of the testing device;
- a plate assembly including a first plate and a second plate parallel to each other, wherein at least one edge of the first plate is received within the first groove and fits closely within the first groove along a length direction and a thickness direction of the testing device, and at least one edge of the second plate is received within the second groove, with a gap present between the at least one edge of the second plate and the second groove along a length direction and/or a thickness direction of the testing device;
- a connector array including a plurality of connector assemblies disposed on the plate assembly in a predetermined pattern, wherein each of the plurality of connector assemblies is connected between the first plate and the second plate;
- a first displacing tool disposed on the bracket configured to displace the second plate relative to the first plate within the second groove along a length direction of the testing device; and
- a second displacing tool disposed on the plate assembly configured to displace the second plate relative to the first plate within the second groove along a thickness direction of the testing device.

* * * * *